United States Patent
Nishimura

(10) Patent No.: US 10,658,219 B2
(45) Date of Patent: May 19, 2020

(54) WORKPIECE HOLDER, INSPECTION APPARATUS, AND WORKPIECE POSITION CORRECTION METHOD

(71) Applicant: SCREEN HOLDINGS CO., LTD., Kyoto (JP)

(72) Inventor: Tomomitsu Nishimura, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 16/475,987

(22) PCT Filed: Nov. 9, 2017

(86) PCT No.: PCT/JP2017/040423
§ 371 (c)(1),
(2) Date: Jul. 3, 2019

(87) PCT Pub. No.: WO2018/168065
PCT Pub. Date: Sep. 20, 2018

(65) Prior Publication Data
US 2019/0353555 A1      Nov. 21, 2019

(30) Foreign Application Priority Data

Mar. 13, 2017   (JP) .................................. 2017-047285

(51) Int. Cl.
*H01L 21/68* (2006.01)
*G01M 11/02* (2006.01)
(Continued)

(52) U.S. Cl.
CPC ......... *H01L 21/681* (2013.01); *G01M 11/025* (2013.01); *G01M 11/0207* (2013.01);
(Continued)

(58) Field of Classification Search
CPC ............... G01N 21/8806; G01N 21/95; G01N 21/9515; B23Q 17/24; G01B 11/2441;
(Continued)

(56) References Cited

U.S. PATENT DOCUMENTS 5,452,521 A *   9/1995   Niewmierzycki ... G01B 11/272
33/520
2010/0246900 A1   9/2010   Ge et al.
(Continued)

FOREIGN PATENT DOCUMENTS

JP    2002-280440 A    9/2002
JP    2008-039447 A    2/2008
(Continued)

OTHER PUBLICATIONS

International Search Report issued in corresponding International Patent Application No. PCT/JP2017/040423, dated Dec. 19, 2017, with English Translation.
(Continued)

*Primary Examiner* — Michelle M Iacoletti
(74) *Attorney, Agent, or Firm* — McDermott Will & Emery LLP

(57) ABSTRACT

A workpiece holder comprises: a holding table including: a chuck mechanism holding the workpiece; a positioning mechanism moving the chuck mechanism in a direction orthogonal to the rotary axis while supporting the chuck mechanism to locate the workpiece; and a rotary mechanism rotating the positioning mechanism about the rotary axis to rotate the workpiece held by the chuck mechanism about the rotary axis; an alignment imaging part capturing an image of the outer peripheral portion of the workpiece held by the chuck mechanism; a misalignment detector detecting misalignment of the symmetry axis with respect to the rotary axis based on the captured image while the workpiece is
(Continued)

rotated by the rotary mechanism; and a workpiece position correction part correcting the position of the workpiece to match the symmetry axis with the rotary axis by moving the chuck mechanism using the positioning mechanism to eliminate the misalignment.

6 Claims, 5 Drawing Sheets

(51) Int. Cl.
  *G01N 21/95* (2006.01)
  *G01B 11/24* (2006.01)
(52) U.S. Cl.
  CPC ............ *G01N 21/95* (2013.01); *H01L 21/68* (2013.01); *G01B 11/2441* (2013.01)
(58) Field of Classification Search
  CPC ............ G01B 11/272; G01M 11/0207; G01M 11/025; G01M 11/0271
  See application file for complete search history.

(56) References Cited

U.S. PATENT DOCUMENTS

| 2011/0109738 A1* | 5/2011 | Sakaguchi ............. G01B 11/02 348/126 |
| 2011/0304856 A1 | 12/2011 | Ge et al. |
| 2012/0069173 A1 | 3/2012 | Takahashi et al. |

FOREIGN PATENT DOCUMENTS

| JP | 2008-082900 A | 4/2008 |
| JP | 2010-019559 A | 1/2010 |
| JP | 2010-223915 A | 10/2010 |
| JP | 2012-002548 A | 1/2012 |
| JP | 2012-063268 A | 3/2012 |
| JP | 2012-187599 A | 10/2012 |
| JP | 2014-178150 A | 9/2014 |

OTHER PUBLICATIONS

Japanese Office Action issued in corresponding Japanese Patent Application No. 2017-047285, dated Sep. 3, 2019, with English translation.

\* cited by examiner

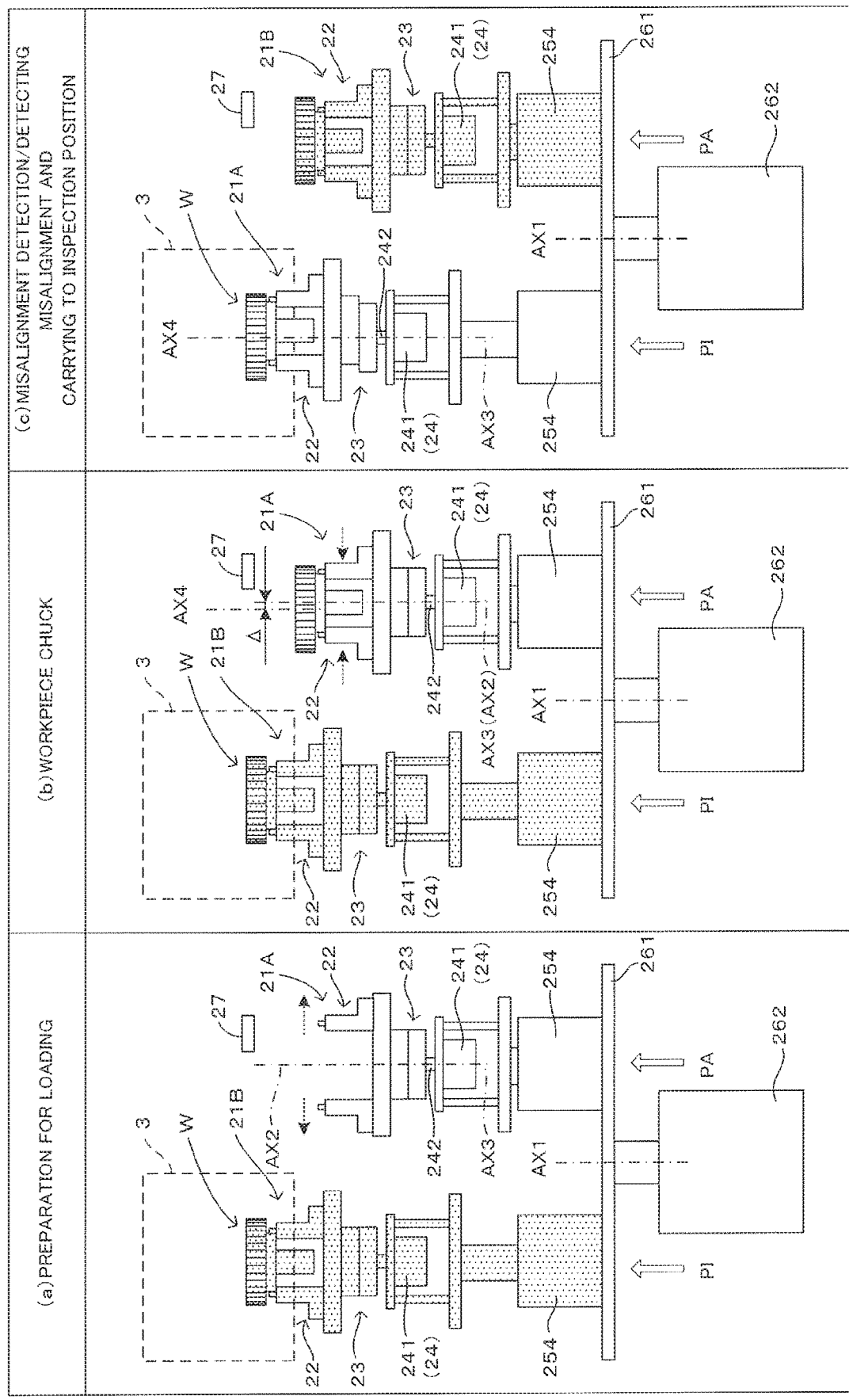

WORKPIECE HOLDER, INSPECTION APPARATUS, AND WORKPIECE POSITION CORRECTION METHOD

TECHNICAL FIELD

The present invention relates to a workpiece holder that rotates a workpiece about a rotary axis while holding the workpiece having an outer peripheral portion rotationally symmetric about a symmetry axis, an inspection apparatus that inspects the workpiece held by the workpiece holder, and a method of correcting the position of the workpiece at the workpiece holder.

CROSS REFERENCE

This application is the U.S. National Phase under 35 US.C. § 371 of international Application No. PCT/JP2017/040423, filed on Nov. 9, 2017, which claims the benefit of Japanese Application No. 2017-047285, filed on Mar. 13, 2017, the entire contents of each are hereby incorporated by reference.

BACKGROUND ART

A workpiece inspection apparatus described in patent literature 1 is known as an example of an apparatus for inspection of the appearance of a workpiece rotationally symmetric about a symmetry axis. In the workpiece inspection apparatus, the workpiece is held by a holder unit connected to a motor. While the workpiece is rotated by the motor, multiple cameras capture images of the workpiece and the appearance of the workpiece are inspected on the basis of the captured images.

CITATION LIST

Patent Literature

[Patent Literature 1] JP 2012-63268 A

SUMMARY OF INVENTION

Technical Problem

The apparatus described in patent literature 1 inspects a gear as a workpiece for any scratches, defects, etc. In the apparatus, the holder unit includes a shaft passed through a through hole penetrating the workpiece in an axis direction, and a clamp mechanism that clamps the workpiece coaxially with the shaft. In response to the rotation of a rotary axis of the motor, the shaft and the workpiece rotate integrally. If the symmetry axis of the workpiece is not matched with the rotary axis of the motor, namely, on the occurrence of misalignment, it becomes difficult to conduct high-accuracy inspection on the basis of the captured images. Therefore, in order to inspect workpieces with high accuracy, it is desirable to have a technology that can rotate the workpiece in a so-called aligned state in which the axis of symmetry of the workpiece is matched the rotary axis of the motor by correcting misalignment of the workpiece with respect to the motor.

The present invention has been made in view of the foregoing problems, and is intended to match a symmetry axis of a workpiece and a rotary axis with each other with high accuracy at a workpiece holder that rotates the workpiece about the rotary axis while holding the workpiece having an outer peripheral portion rotationally symmetric about the symmetry axis.

Solution to Problem

A first aspect of the invention is a workpiece holder that rotates a workpiece about a rotary axis while holding the workpiece having an outer peripheral portion rotationally symmetric about a symmetry axis, the holder comprising: a holding table including: a chuck mechanism that holds the workpiece; a positioning mechanism that moves the chuck mechanism in a direction orthogonal to the rotary axis while supporting the chuck mechanism to locate the workpiece; and a rotary mechanism that rotates the positioning mechanism about the rotary axis to rotate the workpiece held by the chuck mechanism about the rotary axis by; an alignment imaging part that captures an image of the outer peripheral portion of the workpiece held by the chuck mechanism; a misalignment detector that detects misalignment of the symmetry axis with respect to the rotary axis on the basis of the image captured by the alignment imaging part while the workpiece is rotated by the rotary mechanism; and a workpiece position correction part that corrects the position of the workpiece in such a manner as to match the symmetry axis with the rotary axis by moving the chuck mechanism using the positioning mechanism so as to eliminate the misalignment.

A second aspect of the invention is an inspection apparatus that inspects a workpiece having an outer peripheral portion rotationally symmetric about a symmetry axis, the apparatus comprising: the aforementioned workpiece holder; an inspection imaging part that captures an image of the workpiece rotated about the rotary axis by the workpiece holder while the symmetry axis is matched with the rotary axis; and a workpiece inspection part that inspects the workpiece on the basis of the image captured by the inspection imaging part.

A third aspect of the invention is a method of correcting for the position of a workpiece at a workpiece holder that rotates the workpiece about a rotary axis while holding the workpiece having an outer peripheral portion rotationally symmetric about a symmetry axis, the method comprising: a first step of holding the workpiece using a chuck mechanism of the workpiece holder; a second step of detecting misalignment of the symmetry axis with respect to the rotary axis on the basis of an image acquired by imaging of the outer peripheral portion of the workpiece while the chuck mechanism holding the workpiece is rotated about the rotary axis; and a third step of matching the symmetry axis with the rotary axis by moving the chuck mechanism in a direction orthogonal to the rotary axis so as to eliminate the misalignment.

According to the invention having the foregoing configuration, the workpiece having the outer peripheral portion rotationally symmetric about the symmetry axis is held by the chuck mechanism and rotated about the rotary axis. On the basis of the workpiece having been subjected to imaging during the rotation, misalignment of the symmetry axis from the rotary axis is detected. The chuck mechanism is moved in a direction orthogonal to the rotary axis so as to eliminate the misalignment, thereby matching the symmetry axis with the rotary axis.

Advantageous Effects of Invention

As described above, according to the present invention, the position of the workpiece is corrected by moving the chuck mechanism in the direction orthogonal to the rotary axis so as to eliminate the misalignment of the symmetry axis from the rotary axis. This makes it possible to match the symmetry axis and the rotary axis with each other with high accuracy.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

BRIEF DESCRIPTION OF DRAWINGS

FIG. 5 schematically shows the inspecting operation.

DESCRIPTION OF EMBODIMENTS

Figure 1:
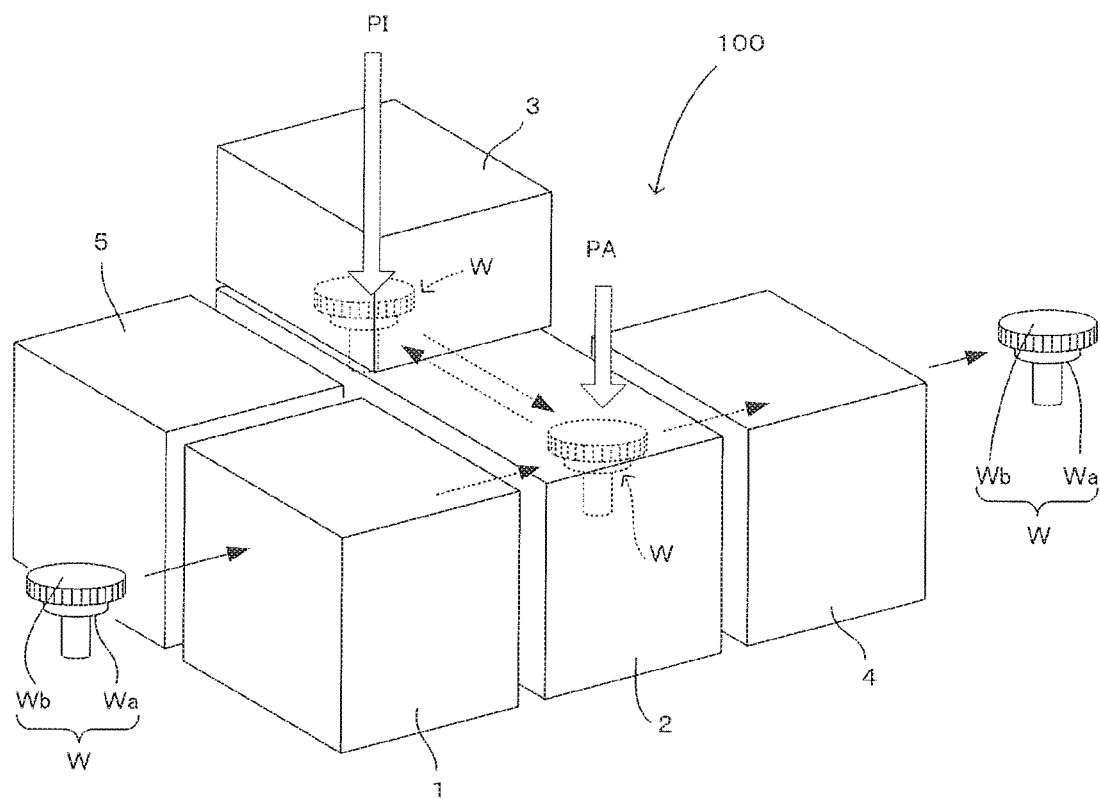
FIG. 1 shows the entire configuration of one embodiment of an inspection apparatus according to the present invention.
Figure 2:
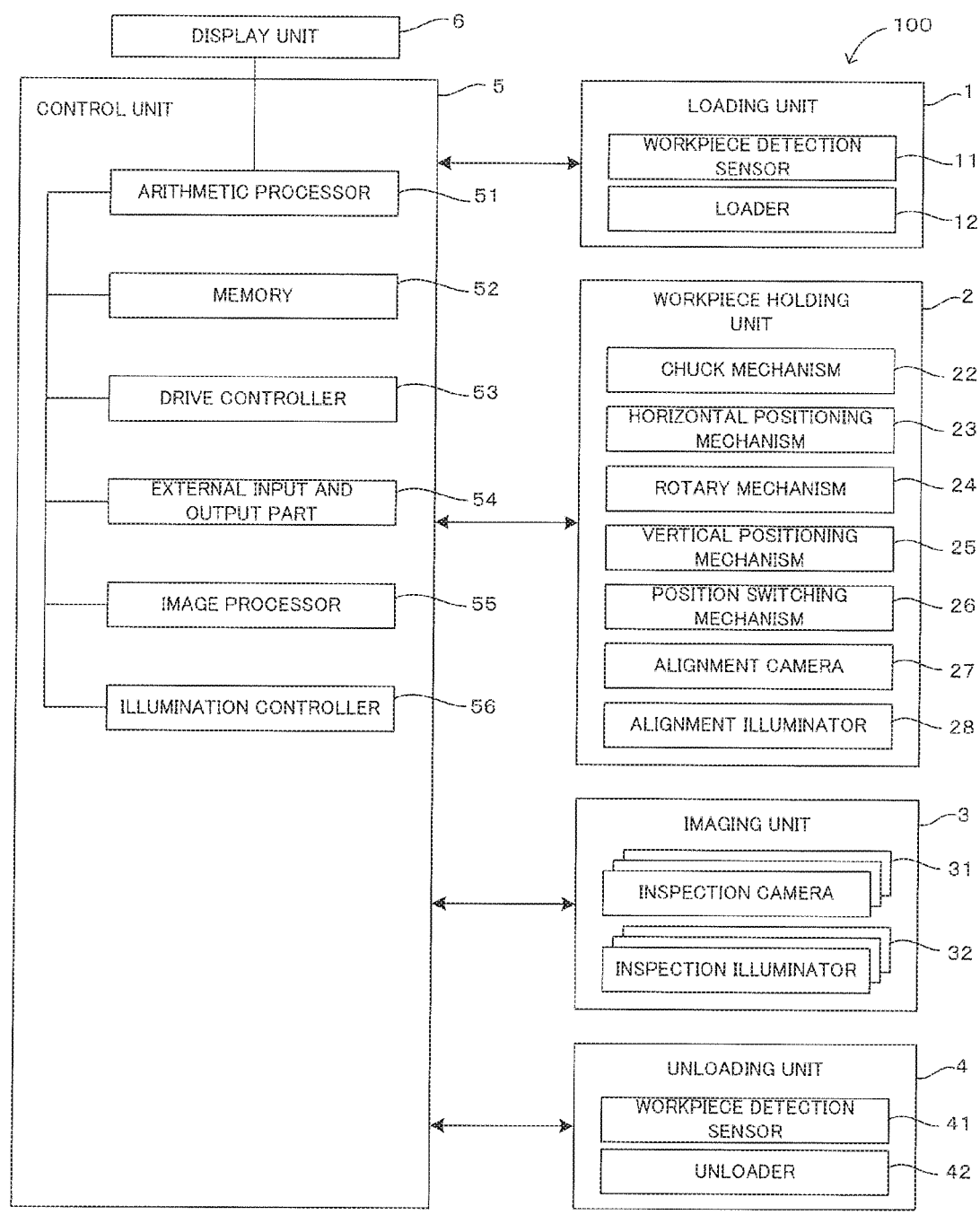
FIG. 2 is a block diagram showing the electrical configuration of the inspection apparatus shown in FIG. 1.

FIG. 1 shows the entire configuration of one embodiment of an inspection apparatus according to the present invention. FIG. 2 is a block diagram showing the electrical configuration of the inspection apparatus shown in FIG. 1. The inspection apparatus 100 is to inspect the appearance of a workpiece W such as a gear or an impeller having an outer peripheral portion of a rotationally symmetric shape about a symmetry axis with projections and recesses provided periodically and repeatedly. The inspection apparatus 100 includes a loading unit 1, a workpiece holding unit 2, an imaging unit 3, an unloading unit 4, and a control unit 5. As shown in FIG. 1, the workpiece W mentioned herein is a machine part with a shaft Wa and a gear Wb provided at the top of the shaft Wa and is formed by forging or casting, for example. After the part is manufactured, the workpiece W is carried to the loading unit 1 by an external transfer robot or an operator.

The loading unit 1 includes a workpiece housing (not shown in the drawings) such as a table or a storage locker. When a workpiece W is temporarily housed into the workpiece housing by the external transfer robot, for example, a workpiece detection sensor 11 (FIG. 2) at the workpiece housing detects the workpiece W, and transmits a signal indicating the detection to the control unit 5 responsible for control of the apparatus entirely. The loading unit 1 includes a loader 12 (FIG. 2). In response to an operation command from the control unit 5, the loading unit 1 receives an uninspected workpiece W in the workpiece housing and carries the uninspected workpiece W to the workpiece holding unit 2.

Figure 3:
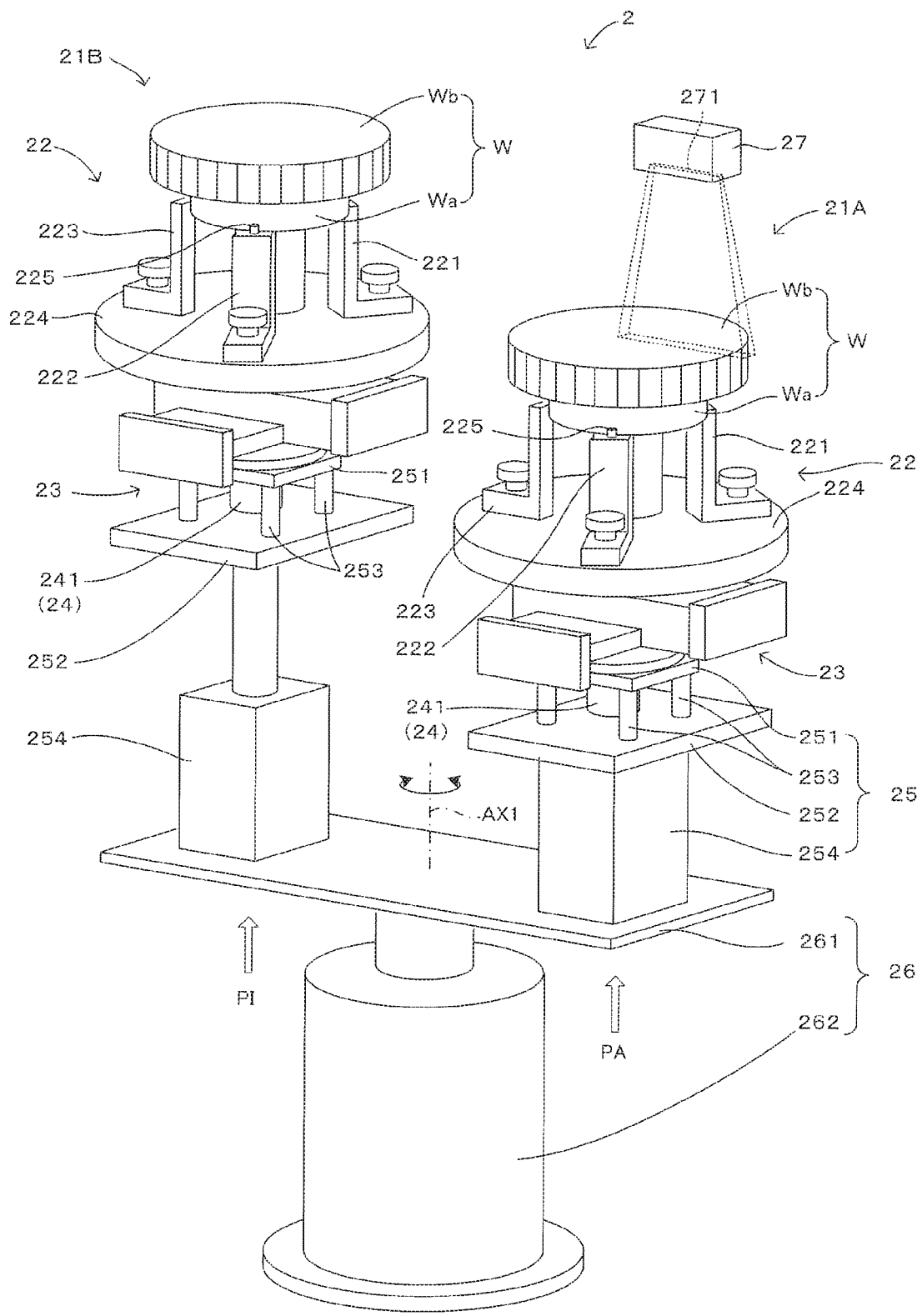
FIG. 3 is a perspective view showing the configuration of the workpiece holding unit.

FIG. 3 is a perspective view showing the configuration of the workpiece holding unit. The workpiece holding unit 2 is equipped with a holding table 21A and a holding table 21B for holding the workpiece W carried by the loader 12. The holding tables 21A and 21B have the same configuration and can hold the workpiece W by grasping a part of the shaft Wa of the workpiece W in a posture in which the gear Wb is in a horizontal position. The configuration of the holding table 21A will be described below by referring to FIG. 3. Meanwhile, as the holding table 21B has the same configuration as the holding table 21A, the holding table 21B will be given the same signs as the holding table 21A and will not be described.

As shown in FIG. 3, the holding table 21A includes a chuck mechanism 22, a horizontal positioning mechanism 23, a rotary mechanism 24, and a vertical positioning mechanism 25 stacked in the vertical direction. The chuck mechanism 22 includes movable members 221 to 223 substantially L-shaped in a side view, and a moving part 224 that moves the movable members 221 to 223 in conjunction with each other in a radial pattern in response to a movement command from the control unit 5. Each of the movable members 221 to 223 has an upper end surface where a projection member 225 is provided, and can be engaged with a stepped part of the shaft Wa using the upper end surface and the projection member 225. Thus, by moving the movable members 221 to 223 to get closer to each other using the moving part 224 in response to a grasp command from the control unit 5, it becomes possible to hold a workpiece W with the center axis of the chuck mechanism 22 (sign AX2 in FIG. 5) and the axis of the shaft Wa matched with each other. Meanwhile, by moving the movable members 221 to 223 to get away from each other using the moving part 224 in response to a release command from the control unit 5, it becomes possible to load an uninspected workpiece W using the loading unit 1 or unload an inspected workpiece W using the unloading unit 4.

The chuck mechanism 22 having the foregoing configuration is supported by the horizontal positioning mechanism 23. The horizontal positioning mechanism 23 includes what is called as an XY table for movements in directions orthogonal to each other in the horizontal direction. Thus, driving the XY table in response to a movement command from the control unit 5 allows high-accuracy positioning of the chuck mechanism 22 on a horizontal plane. Note that, as the XY table, a member using a motor and a ball screw mechanism in combination or a member using two linear motors in combination orthogonal to each other in the horizontal direction is applicable, for example.

The rotary mechanism 24 includes a motor 241. A rotary shaft (sign 242 in FIG. 5) of the motor 241 extends vertically upwardly. The horizontal positioning mechanism 23 is connected to the upper end of the rotary shaft. Thus, when a rotation command is given from the control unit 5, the motor 241 is actuated to rotate the horizontal positioning mechanism 23, the chuck mechanism 22, and a workpiece W grasped by the chuck mechanism 22 integrally about the rotary axis (sign AX3 in FIG. 5) of the motor 241.

In the embodiment, the horizontal positioning mechanism 23 is provided between the chuck mechanism 22 and the rotary mechanism 24, and this has a technical significance of making the respective positions of the axis of the chuck mechanism 22, the symmetry axis (sign AX4 in FIG. 5) of the gear Wb of the workpiece W grasped by the chuck mechanism 22, and the rotary axis of the motor 241 relative to each other adjustable using the horizontal positioning mechanism 23. More specifically, matching the center axis of the chuck mechanism 22 and the rotary axis of the motor 241 with each other allows the workpiece W grasped by the chuck mechanism 22 to rotate about the shaft Wa. In the presence of displacement of the symmetry axis of the gear Wb from the shaft Wa, however, misalignment thereof with respect to the motor 241 occurs to cause unintentional eccentric rotation of the gear Wb. In response to this, the horizontal positioning mechanism 23 is provided to achieve drive so as to correct the amount of the displacement and a direction of the displacement. By doing so, the symmetry axis of the gear Wb and the rotary axis of the motor 241 can be matched with each other. This allows capturing of an image of the gear Wb with high accuracy by the imaging unit 3. As a result, the workpiece W can be inspected with higher accuracy.

The vertical positioning mechanism 25 includes a holding plate 251 holding the motor 241, a base plate 252 arranged below the motor 241, four connecting pins 253 connecting the holding plate 251 and the base plate 252, and an elevator 254 for moving the base plate 252 up and down in the vertical direction. The elevator 254 moves the base plate 252 up and down in response to an up-down command from the control unit 5 to move the rotary mechanism 24, the horizontal positioning mechanism 23, and the chuck mechanism 22 integrally in the vertical direction. By doing so, a workpiece W can be located at an appropriate height position at a pre-alignment position PA and an inspection position PI described next.

As shown in FIG. 3, the holding tables 21A and 21B having the foregoing configuration are fixed on a support plate 261 while being separated by a certain distance. The support plate 261 is supported by a turning driver 262 at an intermediate position between the holding tables 21A and 21B. The turning driver 262 can make the support plate 261 turn 180 degrees about a turning axis AX1 extending in the vertical direction in response to a turning command from the control unit 5. As shown in FIG. 3, the turning driver 262 can make a switch between a first position at which the holding tables 21A and 21B are located at the pre-alignment position PA and the inspection position PI respectively, and a second position at which the holding tables 21A and 21B are located at the inspection position PI and the pre-alignment position PA respectively. For example, in parallel with pre-alignment process on a workpiece W held by the holding table 21A at the pre-alignment position PA, the turning driver 262 makes a switch from the first position to the second position to shift the holding table 21A from the pre-alignment position PA to the inspection position PI. By doing so, the workpiece W after being subjected to the pre-alignment process can be located at the inspection position PI. After inspection of this workpiece W is finished, a turn is made in the opposite direction to shift the holding table 21A from the inspection position PI to the pre-alignment position PA. By doing so, the workpiece W after being subjected to the inspection process can be located at the pre-alignment position PA. In this way, in the embodiment, the support plate 261 and the turning driver 262 form a position switching mechanism 26 for switching the position of the workpiece W.

As described above, the pre-alignment position PA is a position for the pre-alignment process. An alignment camera 27 is arranged above the holding table 21A (or 21B) located at the pre-alignment position PA. As shown in FIG. 3, the alignment camera 27 is arranged on the opposite side of the motor 241 with respect to a workpiece W, namely, above the workpiece W. The alignment camera 27 includes a line sensor 271 extending radially outwardly from the symmetry axis AX4 of the workpiece W. This allows imaging of the upper surface of the workpiece W by the line sensor 271 while rotating the workpiece W. By rotating the workpiece W at least one turn, an image covering all the projections (teeth tips) and the recesses (teeth roots) at the outer peripheral portion of the gear Wb is acquired.

While not shown in FIG. 3, an alignment illuminator 28 (FIG. 2) is provided that illuminates a workpiece W held by the holding table 21A (or 21B) for performing the alignment process favorably. Thus, during capturing of an image of the workpiece W by the alignment camera 27, the workpiece W can be illuminated by the alignment illuminator 28 while the workpiece W is rotated by the rotary mechanism 24. Data about the image of the workpiece W is transmitted to the control unit 5 so that the misalignment is corrected to match the symmetry axis of the gear Wb and the rotary axis of the motor 241 with each other, that is, a pre-alignment process is performed.

The inspection position PI is a position at which the inspection process is performed. The imaging unit 3 is arranged above the holding table 21A (or 21B) located at the inspection position PI. At the inspection position PI, an image of a workpiece W can be captured by the imaging unit 3 while the workpiece W is rotated with the symmetry axis of the gear Wb and the rotary axis of the motor 241 matched with each other. Data about the image of the workpiece W is transmitted to the control unit 5 to perform the inspection process of inspecting the workpiece W for the presence or absence of scratches, defects, etc. at the gear Wb.

As shown in FIG. 2, the imaging unit 3 includes multiple inspection cameras 31 and multiple inspection illuminators 32. The inspection illuminators 32 of the imaging unit 3 are arranged so as to illuminate a workpiece W from various directions held by the holding table 21A (or 21B) located at the inspection position PI. Images of the workpiece W can be captured from various directions by the inspection cameras 31 while the workpiece W is rotated by the rotary mechanism 24 and the workpiece W is illuminated by the inspection illuminators 32. Multiple pieces of data about the captured images are transmitted to the control unit 5 and the workpiece W is inspected by the control unit 5.

The holding table 21A (or 21B) holding the inspected workpiece W is shifted from the inspection position PI to the pre-alignment position PA by the position switching mechanism 26 as described above. Then, the inspected workpiece W is carried out of the holding table 21A (or 21B) by the unloading unit 4. The unloading unit 4 is basically the same as the loading unit 1. More specifically, the unloading unit 4 includes a workpiece housing (not shown in the drawings) for temporarily housing an inspected workpiece W, a workpiece detection sensor 41 (FIG. 2), and an unloader 42 (FIG. 2). In response to an operation command from the control unit 5, the unloading unit 4 carries the inspected workpiece W from the holding table 21A (21B) to the workpiece housing.

As shown in FIG. 2, the control unit 5 is composed of a well-known central processing unit (CPU) for implementation of logic operations, a read only memory (ROM) storing initial setting and others, a random access memory (RAM) for temporarily storing various types of data generated during operation of the apparatus, etc. The control unit 5 functionally includes an arithmetic processor 51, a memory 52, a drive controller 53, an external input and output part 54, an image processor 55, and an illumination controller 56.

The drive controller 53 controls drive of driven mechanisms such as the loader 12 and the chuck mechanism 22 provided at corresponding positions of the apparatus. The external input and output part 54 inputs signals from various types of sensors installed on corresponding positions of the apparatus, and outputs signals to various types of actuators, etc. installed on corresponding positions of the apparatus. The image processor 55 retrieves image data from the alignment camera 27 and the inspection camera 31 and performs image processing such as binarization. The illumination controller 56 controls turning-on, turning-off, etc. of the alignment illuminator 28 and the inspection illuminator 32.

The arithmetic processor 51 has an arithmetic function, and performs a sequence of processes described next by controlling the drive controller 53, the image processor 55, and the illumination controller 56 in accordance with a program stored in the memory 52.

A sign 6 shown in FIG. 2 means a display unit functioning as an interface with an operator. The display unit 6 is connected to the control unit 5 to fulfill the function of displaying an operating state of the inspection apparatus 100. Additionally, the display unit 6 is configured using a touch panel to fulfill a function as an input terminal to accept input from an operator. The display unit 6 is not limited to this configuration but can be configured using a display device for display of an operating state and input terminals such as a keyboard and a mouse.

Figure 4:
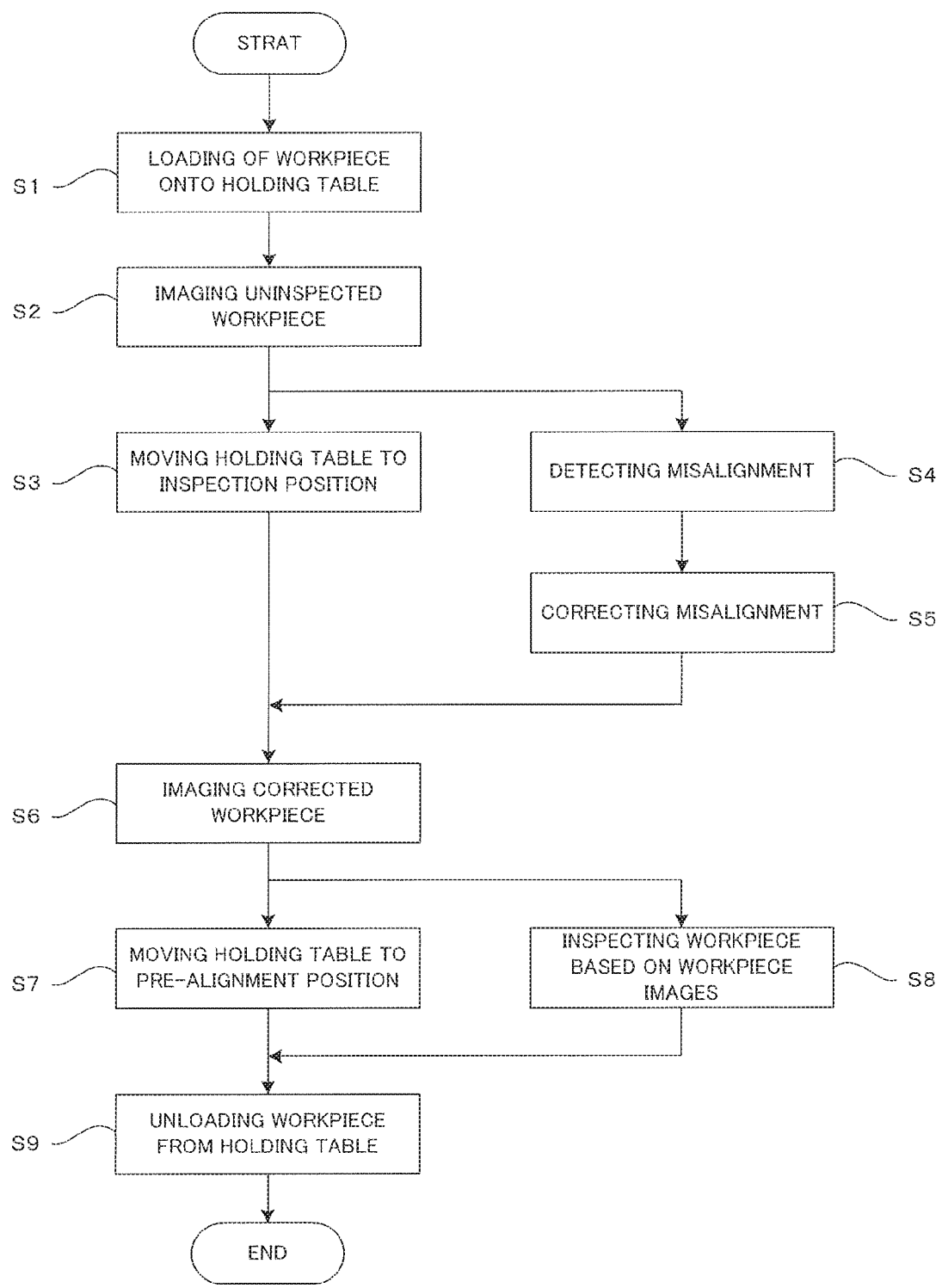
FIG. 4 is a flowchart showing the operation of inspecting a workpiece by the inspection apparatus in FIG. 1.

FIG. 4 is a flowchart showing the operation of inspecting a workpiece by the inspection apparatus in FIG. 1. FIG. 5 schematically shows the inspecting operation. To clearly distinguish the operations of the holding tables 21A and 21B in FIG. 5, dots are given to the holding table 21B and a workpiece W held by the holding table 21B.

In the inspection apparatus 100, according to the inspection program stored in advance in the memory 52 of the control unit 5, the arithmetic processor 51 controls each part of the apparatus to execute the following operations. Here, various operations performed on the workpiece W will be described focusing on one workpiece W with reference to FIGS. 4 and 5. When the control unit 5 confirms that there is no workpiece W at the holding table 21A located at the pre-alignment position PA as shown in the section (a) of FIG. 5 and that the workpiece detection sensor 11 detects an uninspected workpiece W housed in the workpiece housing of the loading unit 1, the control unit 5 starts loading of the workpiece W onto the holding table 21A (step S1). In this loading step, the loader 12 grasps the uninspected workpiece W located in the workpiece housing and carries the uninspected workpiece W from the loading unit 1 to the holding table 21A. In the embodiment, for smoothly performing the loading step and a subsequent step of detecting misalignment, before the workpiece W is carried to the holding table 21A, the control unit 5 performs preparation for accepting the workpiece W in which the center axis AX2 of the chuck mechanism 22 and the rotary axis AX3 of the motor 241 are matched with each other by the horizontal positioning mechanism 23 as shown in the section (a) of FIG. 5 and the three movable members 221 to 223 are moved to get away from each other.

When the workpiece W is carried to the holding table 21A by the loader 12, the chuck mechanism 22 moves the three movable members 221 to 223 to get closer to each other as described above to pinch a part of the shaft Wa of the workpiece W and grasp the workpiece W. More specifically, during the loading operation, the movable members 221 to 223 are moved to get closer each other. While the respective upper end surfaces and the respective projection members 225 of the movable members 221 to 223 are engaged with the stepped part of the shaft Wa to match the center axis AX2 of the chuck mechanism 22 and the axis of the shaft Wa with each other, the workpiece W is held (see the section (b) of FIG. 5). In this way, the loading step is finished. At the time of the finish, the rotary axis AX3 of the motor 241, the center axis AX2 of the chuck mechanism 22, and the axis of the shaft Wa are matched with each other. However, in some case that the workpiece W is manufactured by forging or casting, the symmetry axis AX4 of the gear Wb is displaced from the axis of the shaft Wa to cause misalignment of the workpiece W with respect to the motor 241 as shown in the section (b) of FIG. 5, for example.

In this regard, in the embodiment, the uninspected workpiece W is illuminated by the alignment illuminator 28 (FIG. 2) and an image of the gear Wb is captured by the alignment camera 27 while the uninspected workpiece W is rotated by the motor 241 of the holding table 21A. Data about the image is stored into the memory 52 (step S2).

After this imaging is finished, the turning driver 262 makes a switch from the first position to the second position. More specifically, the turning driver 262 turns the support plate 261 180 degrees about the turning axis AX1. By doing so, as shown in the section (c) of FIG. 5, the holding table 21A holding the uninspected workpiece W is moved from the pre-alignment position PA to the inspection position PI and the elevator 254 moves the workpiece W to a height position at which an image of the workpiece W can be captured by the imaging unit 3 (step S3).

In the embodiment, in parallel with the foregoing movements, the image data about the workpiece W is read from the memory 52 and misalignment of the workpiece W with respect to the rotary mechanism 24 (motor 241) is detected (step S4). In the embodiment, the misalignment corresponds to information containing a displacement amount Δ and a displacement direction. Next, the misalignment is corrected at the holding table 21A (step S5). This misalignment correction is made by moving the chuck mechanism 22 using the horizontal positioning mechanism 23 so as to eliminate the misalignment detected in step S4 described above. By doing so, as shown in the section (c) of FIG. 5, the symmetry axis of the gear Wb and the rotary axis of the motor 241 are matched with each other at the time of arrival of the holding table 21A at the inspection position PI, or before or after the arrival. Thus, a workpiece imaging step (step S6) can be started immediately.

In step S6, the rotary mechanism 24 of the holding table 21A located at the inspection position PI is actuated to start workpiece rotation. In this step, the workpiece W held by the holding table 21A is in a so-called aligned state, which has undergone the foregoing misalignment correction, and rotates about the symmetry axis AX4. In response to this rotation, the plurality of inspection illuminators 32 are turned on to illuminate the rotating workpiece W from multiple directions. While the inspection illuminators 32 are turned on after the workpiece rotation, this is not the only timing for the turning-on. The turning-on of the inspection illuminators 32 may be started simultaneously with start of the rotation or before start of the rotation.

While the workpiece W is rotated and illuminated in this way, the plurality of inspection cameras 31 capture images of the workpiece W from various directions, and image data about the images of the workpiece W (hereinafter called "workpiece images") captured from the multiple directions is transmitted to the control unit 5. The control unit 5 stores the transmitted image data into the memory 52, and inspects the workpiece W on the basis of the stored image data by following timing described below.

After the images are acquired in this way, the workpiece rotation is stopped at the holding table 21A, and the inspection illuminators 32 are turned off at the imaging unit 3. Further, the turning driver 262 turns the support plate 261 reversely 180 degrees about the turning axis AX1. By doing so, the holding table 21A is moved from the inspection position PI to the pre-alignment position PA while holding the inspected workpiece W. Further, the elevator 254 moves the workpiece W to its original height position (step S7). In parallel with this movement of the workpiece W, the control unit 5 reads the image data from the memory 52, and determines the presence or absence of scratches, defects, etc. at the gear Wb on the basis of the read workpiece images. In this way, workpiece inspection is conducted on the workpiece W held by the holding table 21A (step S8).

The workpiece W having returned to the pre-alignment position PA is grasped by the unloader 42. Thereafter, the workpiece W is released from the grasp by the movable members 221 to 223. Thus, the transfer of the workpiece W from the holding table 21A to the unloader 42 is carried out. Next, the unloader 42 carries the workpiece W to the unloading unit 4 and houses the workpiece W into the workpiece housing (not shown in the drawings) (step S9). The foregoing sequence of steps (steps S1 to S9) is performed repeatedly and alternately by the holding tables 21A and 21B.

As described above, in the embodiment, on the basis of the image about the workpiece W acquired by imaging of the workpiece W while the workpiece W is rotated about the rotary axis AX3 by the holding table 21A or 21B, displacement of the symmetry axis AX4 from the rotary axis AX3, namely, misalignment is detected. At each of the holding tables 21A and 21B, the horizontal positioning mechanism 23 is provided to move the chuck mechanism 22 in a direction (in the embodiment, horizontal direction) orthogonal to the rotary axis AX3 so as to eliminate the foregoing misalignment. In this way, the workpiece position is corrected. This makes it possible to match the symmetry axis AX4 of the workpiece W and the rotary axis AX3 of the motor 241 with each other with high accuracy.

In the embodiment, a workpiece W is held by moving the three movable members 221 to 223 simultaneously toward the center axis AX2, and this allows the symmetry axis AX4 of the workpiece W to get closer to the center axis AX2. Additionally, an image of the workpiece W is captured while the workpiece W held by the movable members 221 to 223 is rotated with the center axis AX2 matched with the rotary axis AX3. By having these configurations, an image of the workpiece W can be captured reliably by the alignment camera 27 to achieve detection of the foregoing misalignment favorably.

In the embodiment, the position correction of the workpiece W having detection and correction of the misalignment in parallel with movement of the holding table 21A or 21B from the pre-alignment position PA to the inspection position PI. Thus, tact time can be reduced. Movement of the holding table 21A or 21B to the inspection position PI may be started after the misalignment is detected on the basis of the image of the workpiece W captured by the alignment camera 27, and the misalignment may be corrected during this movement. In this case, comparable action and effect are achieved. More specifically, reduction in tact time can be encouraged by detecting and correcting the misalignment (correcting the position of the workpiece W) at least partially in parallel with the movement of the holding table 21A or 21B from the pre-alignment position PA to the inspection position PI.

The horizontal positioning mechanism 23 of the embodiment corresponds to an example of a "positioning mechanism" of the present invention. The alignment camera 27 and the inspection camera 31 correspond to an example of an "alignment imaging part" and an example of an "inspection imaging part" respectively of the present invention. The position switching mechanism 26 functions as a "table moving mechanism" of the present invention, and moves the holding table 21A or 21B between the pre-alignment position PA and the inspection position PI corresponding to an example of a "non pre-alignment position" of the present invention. The workpiece holding unit 2 and the control unit 5 form a "workpiece holder" of the present invention. In particular, the arithmetic processor 51 of the control unit 5 functions as a "misalignment detector" and a "workpiece position correction part" of the present invention. The control unit 5 functions as a "workpiece inspection part" of the present invention.

The present invention is not limited to the foregoing embodiment but can be changed in various ways other than those described above within a range not deviating from the substance of the invention. For example, in the foregoing embodiment, the present invention is applied to the workpiece holder that holds a workpiece W with the gear Wb and the inspection apparatus equipped with the workpiece holder. However, this is not the only type of workpiece W but the "workpiece" mentioned in the present invention covers every kind of workpiece having an outer peripheral portion rotationally symmetric about a symmetry axis.

The configuration of the foregoing embodiment is such that a workpiece W is grasped by the three movable members 221 to 223. In an alternative configuration, the workpiece W may be held by two, or four or more movable members.

In the foregoing embodiment, the workpiece holder or the workpiece position correction method according to the present invention is applied to the inspection apparatus 100 that detects misalignment while locating the two holding tables 21A and 21B alternately at the pre-alignment position PA. The present invention is further applicable to a workpiece holder or an inspection apparatus including one, or three or more holding tables.

In the foregoing embodiment, the present invention is applied to the inspection apparatus 100 in which the pre-alignment position PA is separated from the inspection position PI. The present invention is further applicable to an inspection apparatus in which the pre-alignment position PA and the inspection position PI are identical with each other, namely, an inspection apparatus that performs inspection process after detecting and correcting misalignment at an inspection position. In the inspection apparatus having this configuration, the inspection camera 31 may partially function as the alignment camera 27.

Although the invention has been described by way of the specific embodiments above, this description is not intended to be interpreted in a limited sense. By referring to the description of the invention, various modifications of the disclosed embodiments will become apparent to a person skilled in this art similarly to other embodiments of the invention. Hence, appended claims are thought to include these modifications and embodiments without departing from the true scope of the invention.

INDUSTRIAL APPLICABILITY

The present invention is applicable to a workpiece holder that rotates a workpiece about a rotary axis while holding the workpiece having an outer peripheral portion rotationally symmetric about a symmetry axis, an inspection apparatus that inspects the workpiece held by the workpiece holder, and a method of correcting the position of the workpiece in general.

REFERENCE SIGNS LIST 5 control unit (workpiece position correction part, workpiece inspection part)
21A holding table
21B holding table
22 chuck mechanism
23 horizontal positioning mechanism
24 a rotary mechanism
27 alignment camera (alignment imaging part)
31 inspection camera (inspection imaging part)
51 arithmetic processor (misalignment detector, workpiece position correction part)
100 inspection apparatus
221-223 movable member
271 line sensor
AX2 center axis (of the chuck mechanism)
AX3 rotary axis (of the motor 241)
AX4 symmetry axis
PA pre-alignment position
PI inspection position (non pre-alignment position)
W workpiece
Δ displacement amount

The invention claimed is:

1. A workpiece holder that rotates a workpiece about a rotary axis while holding the workpiece having an outer peripheral portion rotationally symmetric about a symmetry axis, the holder comprising:
a holding table including: a chuck configured to hold the workpiece; a positioning mechanism, comprising an X-Y table, configured to move the chuck in a direction orthogonal to the rotary axis while supporting the chuck to locate the workpiece; and a rotary mechanism, comprising a motor, configured to rotate the positioning mechanism about the rotary axis to rotate the workpiece held by the chuck about the rotary axis;
a first camera configured to capture an image of the outer peripheral portion of the workpiece held by the chuck; and
a processor configured to:
detect misalignment of the symmetry axis with respect to the rotary axis on the basis of the image captured by the first camera while the workpiece is rotated by the rotary mechanism; and
correct the position of the workpiece in such a manner as to match the symmetry axis with the rotary axis by moving the chuck using the positioning mechanism so as to eliminate the misalignment.

2. The workpiece holder according to claim 1, wherein the chuck includes a plurality of movable members and is configured to move the movable members to get closer to and away from a center axis, and move all the movable members simultaneously toward the center axis to hold the workpiece.

3. The workpiece holder according to claim 2, wherein the the processor is configured to control the rotary mechanism to rotate the workpiece held by the chuck while the workpiece is positioned so as to match the center axis with the rotary axis.

4. The workpiece holder according to claim 1, wherein the holding table is configured to be movable between a pre-alignment position for imaging of the workpiece by the first camera and a non pre-alignment position separated from the pre-alignment position, and
at least a part of the detection of the misalignment and the correction of the position of the workpiece is performed while the holding table moves from the pre-alignment position to the non pre-alignment position.

5. An inspection apparatus that inspects a workpiece having an outer peripheral portion rotationally symmetric about a symmetry axis, the apparatus comprising:
the workpiece holder according to claim 1; and
a second camera configured to capture an image of the workpiece rotated about the rotary axis by the workpiece holder while the symmetry axis is matched with the rotary axis, wherein
the processor is configured to inspect the workpiece on the basis of the image captured by the second camera.

6. A method of correcting for the position of a workpiece at a workpiece holder that rotates the workpiece about a rotary axis while holding the workpiece having an outer peripheral portion rotationally symmetric about a symmetry axis, the method comprising:
a first step of holding the workpiece using a chuck of the workpiece holder;
a second step of detecting misalignment of the symmetry axis with respect to the rotary axis on the basis of an image acquired by imaging of the outer peripheral portion of the workpiece while the chuck holding the workpiece is rotated about the rotary axis; and
a third step of matching the symmetry axis with the rotary axis by moving the chuck in a direction orthogonal to the rotary axis so as to eliminate the misalignment.

* * * * *